(12) United States Patent
Guo (10) Patent No.: US 11,116,102 B2
(45) Date of Patent: Sep. 7, 2021

(54) DISPLAY DEVICE

(71) Applicants: K-TRONICS (SUZHOU) TECHNOLOGY CO., LTD., Suzhou (CN); BOE TECHNOLOGY GROUP CO., LTD., Beijing (CN)

(72) Inventor: Junli Guo, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,891

(22) PCT Filed: Mar. 11, 2019

(86) PCT No.: PCT/CN2019/077632
§ 371 (c)(1),
(2) Date: Feb. 27, 2020

(87) PCT Pub. No.: WO2019/179324
PCT Pub. Date: Sep. 26, 2019

(65) Prior Publication Data
US 2020/0352048 A1   Nov. 5, 2020

(30) Foreign Application Priority Data
Mar. 21, 2018   (CN) .......................... 201810235316.7

(51) Int. Cl.
*H05K 7/14*      (2006.01)
*F16B 5/06*      (2006.01)
(Continued)

(52) U.S. Cl.
CPC ......... *H05K 7/1417* (2013.01); *F16B 5/0664* (2013.01); *H05K 1/02* (2013.01); *H05K 5/0017* (2013.01)

(58) Field of Classification Search
CPC ...... H05K 7/1417; H05K 1/02; H05K 5/0017; F16B 5/0664; F16B 21/076; F16B 21/075
See application file for complete search history.

(56) References Cited

U.S. PATENT DOCUMENTS 5,051,021 A * 9/1991 Pelz .................... F16B 21/09
                                                      403/316
7,206,036 B2   4/2007 Lin et al.
(Continued)

FOREIGN PATENT DOCUMENTS

CN       202101077 U    1/2012
CN       202363329 U    8/2012
(Continued)

OTHER PUBLICATIONS

International Search Report and Written Opinion dated May 29, 2019 for corresponding PCT Application No. PCT/CN2019/077632.
(Continued)

*Primary Examiner* — Mukundbhai G Patel
(74) *Attorney, Agent, or Firm* — Kinney & Lange, P.A.

(57) ABSTRACT

A display device is provided. The display device includes a backplane, a board, a first fastener arranged on the backplane, and a second fastener arranged on the board. The first fastener is in snap-fit connection with the second fastener.

15 Claims, 3 Drawing Sheets

(51) Int. Cl.
　　　*H05K 1/02*　　　(2006.01)
　　　*H05K 5/00*　　　(2006.01)

(56) References Cited

U.S. PATENT DOCUMENTS

| | | | |
|---|---|---|---|
| 8,072,747 B2 * | 12/2011 | Yao | B60R 11/02 |
| | | | 361/679.43 |
| 8,842,444 B2 * | 9/2014 | Kuan | F16M 13/02 |
| | | | 361/825 |
| 9,285,757 B2 * | 3/2016 | Uchida | H05K 5/0213 |
| 9,510,440 B2 | 11/2016 | Nam et al. | |

FOREIGN PATENT DOCUMENTS

| | | |
|---|---|---|
| CN | 103438560 A | 12/2013 |
| CN | 203734027 U | 7/2014 |
| CN | 204576014 U | 8/2015 |
| CN | 205408332 U | 7/2016 |
| CN | 205454333 U | 8/2016 |
| CN | 206023962 U | 3/2017 |
| CN | 206209244 U | 5/2017 |
| CN | 206282994 U | 6/2017 |
| CN | 206413097 U | 8/2017 |
| CN | 206704416 U | 12/2017 |
| CN | 206805082 U | 12/2017 |
| WO | 2013058938 A1 | 4/2013 |

OTHER PUBLICATIONS

First Chinese Office Action dated Nov. 4, 2020, received for corresponding Chinese Application No. 201810235316.7, 16 pages.

* cited by examiner

DISPLAY DEVICE

CROSS-REFERENCE TO RELATED APPLICATION(S)

This application is a U.S. national phase application of a PCT Application No. PCT/CN2019/077632 filed on Mar. 11, 2019, which claims a priority to Chinese Patent Application No. 201810235316.7 filed in China on Mar. 21, 2018, the disclosure of which is incorporated in its entirety by reference herein.

TECHNICAL FIELD

The present disclosure relates to the field of display technologies, in particular to a display device.

BACKGROUND

Conventionally, a board is used in a display device such as a display or a television. The board is generally fixed on a backplane by screw fixation. The screw fixation requires at least 4 screws to fix the board during assembly, and a stud needs to be added to the backplane. As a result, a manual assembly/disassembly takes a long time and is inconvenient. Further, a material cost of the screws and a labor cost are increased, and a production efficiency is low.

SUMMARY

A display device is provided by the present disclosure. The display device includes a backplane, a board, a first fastener arranged on the backplane, and a second fastener arranged on the board. The first fastener is in snap-fit connection with the second fastener.

Optionally, the first fastener is in detachable snap-fit connection with the second fastener.

Optionally, the first fastener includes a plurality of slots provided on the backplane; the second fastener includes a plurality of hooks provided on the board; the hook is snapped into the slot.

Optionally, the backplane includes a mounting surface for mounting the board; a convex plate is arranged on the mounting surface, a cavity is provided inside the convex plate; the convex plate includes a top plate and a side surface surrounding the top plate peripherally; the slot includes an opening arranged on the side surface and leading to the cavity.

Optionally, the convex plate and the backplane are provided integrally.

Optionally, the opening includes a first edge located on a side proximate to the top plate and a second edge opposite to the first edge; a folded edge is provided at the second edge; the folded edge is integrally connected with the side surface, and is bent into the cavity; the folded edge cooperates with the top plate to limit a position of the hook in a first direction perpendicular to the mounting surface.

Optionally, a limiting block is protrudingly provided on the top plate; a limiting hole cooperating with the limiting block is arranged on the board, and the limiting hole is located on one side of the hook; the limiting block is placed in the limiting hole; the limiting block cooperates with the limiting hole to limit a position of the board in a direction parallel to the mounting surface.

Optionally, the limiting hole is an elongated hole extending in a second direction parallel to the mounting surface, and the elongated hole includes a first end and a second end opposite to each other; the limiting block includes a first limiting block and a second limiting block spaced apart in the second direction, the first limiting block is located at the first end, and the second limiting block is located at the second end.

Optionally, an inner edge of the first end of the elongated hole is curved, and an inner edge of the second end of the elongated hole is rectilinear; the first limiting block has a curved surface that matches in shape with the inner edge of the first end of the elongated hole, and the second limiting block has a flat surface that matches in shape with the inner edge of the second end of the elongated hole.

Optionally, the hook includes an elastic sheet structure, the elastic sheet structure includes a first part and a second part, and the first part is connected to the board, the second part is formed by bending and extending a side of the first part that is away from the board, and the elastic sheet structure is in snap-fit connection with the opening.

Optionally, the elastic sheet structure and the board are of an integral structure, and the elastic sheet structure is formed by depressing the board toward the backplane.

Optionally, the elastic sheet structure is V-shaped.

Optionally, the elastic sheet structure further includes a third part, the third part is formed by bending and extending a side of the second part that is away from the first part, a joint between the first part and the second part abuts against the folded edge, and the third part abuts against the top plate.

Optionally, the top plate is provided, at a position corresponding to the opening, with a through hole leading to the cavity.

DETAILED DESCRIPTION

In order to make the objects, technical solutions and advantages of the embodiments of the present disclosure more clear, the technical solutions of the embodiments of the present disclosure will be specifically described below in conjunction with the drawings and the embodiments of the present disclosure.

In view of the technical problems in the related art of inconvenient assembly and disassembly, increased material cost and labor cost since a board and a backplane of a display device are fixed by screw fixation, a display device is provided by the present disclosure, such that the board and the backplane may be conveniently assembled and disassembled, and the labor cost and the material cost may be reduced, so as to improve production efficiency.

As shown in FIG. 1 to FIG. 5, the display device provided by some embodiments of the present disclosure includes a backplane 100, a board 200, a first fastener arranged on the backplane, and a second fastener arranged on the board. The first fastener is in snap-fit connection with the second fastener. In an embodiment of the present disclosure, the first fastener is in detachable snap-fit connection with the second fastener. The first fastener includes a plurality of slots arranged on the backplane 100; the second fastener includes a plurality of hooks provided on the board 200; the hook is snapped into the slot to fix the backplane 100 to the board 200 by snap-fit.

In the above solution, the slot is arranged on the backplane 100, and the hook is arranged on the board 200. The board 200 may be assembled with the backplane 100 by merely snapping the hook into the slot; and the board 200 may be disassembled from the backplane 100 by merely detaching the hook from the slot. Compared with connecting the board 200 and the backplane 100 by screw fixation in the related art, the snap-fit connection of the board 200 and the backplane 100 not only provides a simple structure and enables a quick assembly and disassembly of the board 200 and the backplane 100, so as to reduce the labor cost and greatly improve the production efficiency, but also eliminates the need for screws, which can reduce a screw material cost, and improve product competitiveness.

It should be noted that, in the above solution, the board 200 may be a motherboard 200 of the display device or other various types of boards 200. The display device provided by some embodiments of the present disclosure may be various types of display devices such as a mobile phone or a tablet computer.

In the display device provided by the present disclosure, there may be a variety of manners for connecting the board 200 with the backplane 100 by snap-fit. In order to describe the display device provided by some embodiments of the present disclosure in more detail, an optional snap-fit connection structure for the board 200 and the backplane 100 is provided below.

Figure 1:
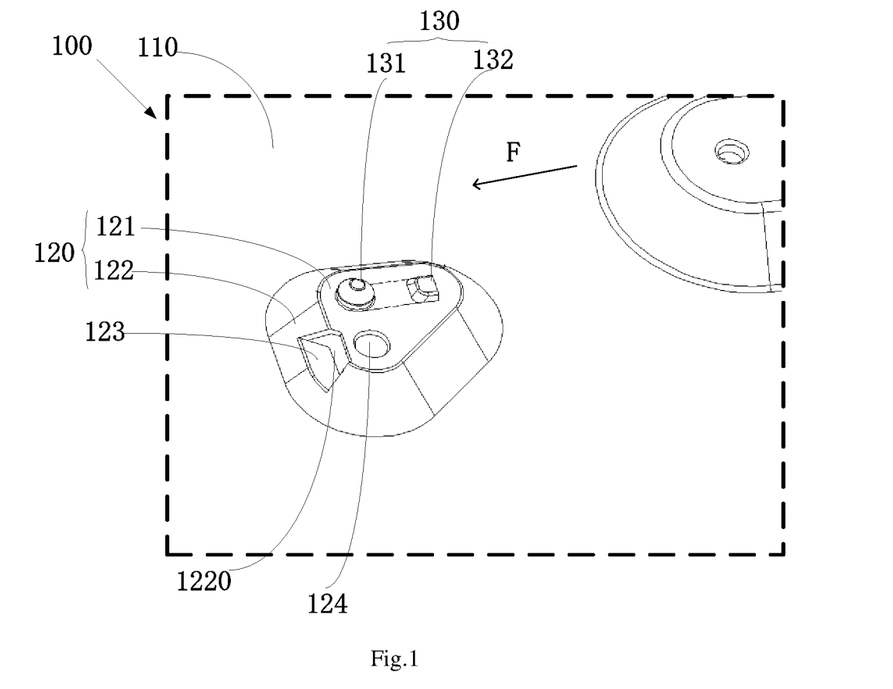
FIG. 1 is a stereogram showing a partial structure of a backplane in a display device according to some embodiments of the present disclosure.
Figure 3:
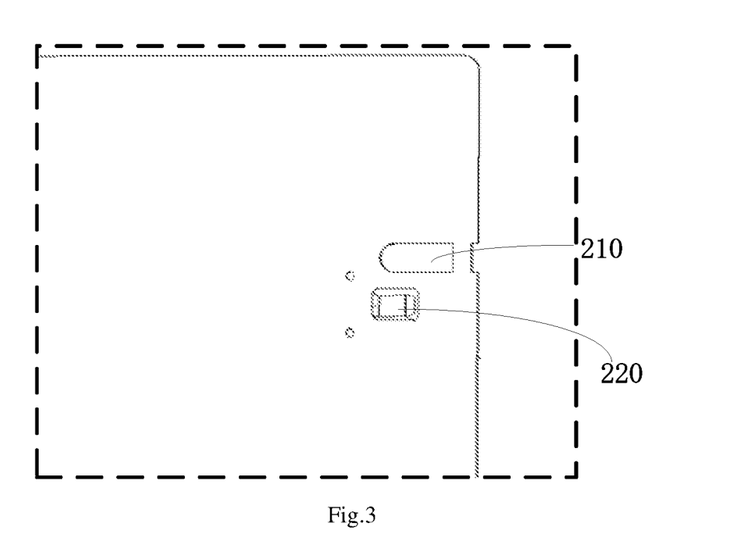
FIG. 3 is a front view showing a partial structure of a backplane in a display device according to some embodiments of the present disclosure.

As shown in FIG. 1 and FIG. 3, in an optional embodiment of the present disclosure, the backplane 100 includes a mounting surface 110 for mounting the board 200; a convex plate 120 is arranged on the mounting surface 110, a cavity is provided inside the convex plate 120; the convex plate 120 includes a top plate 121 and a side surface 122 surrounding the top plate 121 peripherally; the side surface 122 is provided with an opening 1220 leading to the cavity, and the opening 1220 is formed as the slot. In other words, the top plate 121 is substantially parallel to the mounting surface 110 and is spaced from the mounting surface 110; the side surface 122 is located between the top plate 121 and the mounting surface 110, and is connected to an edge of the top plate 121 and the mounting surface 110 respectively; and the side surface 122 surrounds the cavity.

According to the above solution, a surface on the backplane 100 for assembling the board 200 is the mounting surface 110 of the backplane 100; the assembling surface 110 may be a planar surface of the backplane 100; the protruding convex plate 120 is arranged on the mounting surface 110; and the convex plate 120 is hollow inside; the opening 1220 is formed on the side surface 122 of the convex plate 120; the opening 1220 can be used as the slot, to cooperate with the hook on the board 200. Thus, by arranging the hollow convex plate 120 on the mounting surface 110 of the backplane 100 and providing the opening 1220 on the convex plate 120 to form the slot, the hook on the board 200 can be snapped into the opening 1220 to achieve a snap-fit connection. In addition, one of edges of the opening 1220 is located on a side proximate to the top plate 121 of the convex plate 120 (hereinafter referred to as a first edge), and the other edge which is opposite to the first edge is located on a side proximate to the mounting surface 110 (hereinafter referred to as a second edge). When the hook is snapped into the opening 1220, the second edge of the opening 1220 cooperates with the first edge, or the second edge cooperates with the top plate 121 of the convex plate 120, to limit the position of the hook in a first direction perpendicular to the mounting surface 110 (hereinafter referred to as upper position limit and lower position limit).

Of course, it can be understood that, in practice, other structures may be used to provide the slot on the backplane 100. For example, the opening is directly formed on the mounting surface 110 of the backplane 100, and the opening is used as the slot. It is simpler in structure, compared with the above-mentioned manner that the opening is formed on the side surface of the convex plate. However, the opening directly formed on the planar surface of the backplane can only implement the upper position limit of the hook, but not the lower position limit. Alternatively, a concave cavity formed by depressing the mounting surface may be provided on the backplane; a side wall of the concave cavity is provided with an opening to form the slot. However, compared with the above-mentioned manner of providing the opening on the side surface of the convex plate, if the opening is formed on the side wall of the concave cavity, the hook will protrude from the opening on the side wall of the concave cavity, such that the hook is exposed out of the concave cavity, which looks ugly, and is susceptible to accidental touch, such that the hook is detached from the opening. While in the foregoing optional embodiment, the hook can extend through the opening on the side surface of the convex plate into the cavity of the convex plate, thus the hook is concealed and is not susceptible to accidental touch.

In addition, it should be noted that the quantity and the specific distribution positions of the convex plates 120 provided on the backplane 100 can be reasonably configured according to actual needs, which is not limited herein.

In addition, in the optional embodiment of the present disclosure, the convex plate 120 may be a stamped convex plate formed by stamping and provided integrally with the backplane 100. According to the above solution, the backplane is generally a metal backplane 100, and the convex plate 120 can be formed by a stamping forming process, and the convex plate 120 and the backplane 100 are of an integral structure, so that the manufacturing process is simple.

Of course, it can be understood that, in practice, a separate convex plate 120 may also be arranged on the backplane 100; or in case that the backplane 100 is a plastic backplane, the convex plate 120 may also be formed integrally with the backplane 100 by injection molding or the like.

In addition, in the optional embodiment of the present disclosure, as shown in FIG. 1 and FIG. 3, a folded edge 123 is arranged at the second edge of the opening 1220. The folded edge 123 is integrally connected with the side surface 122 and is bent into the cavity, to cooperate with the top plate 121 to form a position limit space, so as to implement the upper position limit and the lower position limit of the hook in a first direction perpendicular to the mounting surface 110.

According to the above solution, the folded edge 123 is arranged on the second edge of the opening 1220, and the folded edge 123 is bent toward the interior of the convex plate 120 with respect to the side surface 122 of the convex plate 120, as a result, the position limit space is formed between the top plate 121 of the convex plate 120 and the folded edge 123. When the hook on the board 200 is snapped into the opening 1220, the hook abuts against both the folded edge 123 and the top plate 121, so as to implement the upper position limit and the lower position limit of the hook on the board 200 in the first direction.

It should be noted that, in the above solution, a folded edge 123 is arranged on the second edge of the opening 1220 to perform the upper position limit and the lower position limit of the hook. In practice, a folded edge 123 may also be arranged at other edges of the opening 1220 to limit the position of the hook in other directions.

In addition, in the above solution, optionally, the folded edge 123 at the second edge of the opening 1220 is a stamped folded edge 123 formed by a stamping and bending process. Of course, it can be understood that the specific structure and the specific forming process of the folded edge 123 are not limited. For example, the folded edge 123 may be formed integrally with the backplane 100 by injection molding or the like, or the folded edge 123 may be connected to the second edge of the opening 1220 by soldering or the like.

In the above solution, by arranging the folded edge 123 at the second edge of the convex plate 120, and using the folded edge 123 to cooperate with the top plate 121 of the convex plate 120, the upper position limit and the lower position limit of the hook on the board 200 in the first direction perpendicular to the mounting surface 110 of the backplane 100 can be achieved. To make the connection between the backplane 100 and the board 200 stable, it is also necessary to limit the position of the board 200 in a direction parallel to the mounting surface 110 of the backplane 100 (hereinafter referred to as a left position limit and a right position limit). Thus, in the optional embodiment of the present disclosure, in order to achieve the left position limit and right position limit of the board 200 relative to the backplane 100, a parallel position limit structure configured for limiting the position of the board 200 in the direction parallel to the mounting surface 110 is also arranged on the convex plate 120.

Optionally, the parallel position limit structure is implemented as follows: as shown in FIG. 1 to FIG. 5, a protruding limiting block 130 is arranged on the top plate 121; a limiting hole 210 cooperating with the limiting block 130 is arranged on the board 200, and the limiting hole 210 is located on one side of the hook; the limiting block 130 is placed in the limiting hole 210, to limit a position of the board 200 in a direction parallel to the mounting surface 110.

According to the above solution, by providing the limiting block 130 on the top plate 121 of the convex plate 120, and providing the limiting hole 210 on the board 200, the left position limit and the right position limit of the board 200 in the direction parallel to the mounting surface 110 are achieved by using the cooperation between the limiting block 130 and the limiting hole 210. The position limit structure is simple. It should be noted that the parallel position limit structure is not limited thereto, and can also be implemented in other manners. For example, alternatively, the limiting hole is formed on the top plate 121 of the convex plate 120, and the limiting block is arranged on the board 200, and the limiting block is placed in the limiting hole, so as to implement the left position limit and the right position limit of the board 200 in the direction parallel to the mounting surface 110.

In the optional embodiment of the present disclosure, as shown in FIG. 1 to FIG. 5, the limiting hole 210 is an elongated hole extending in a second direction parallel to the mounting surface 110, and the elongated hole includes a first end and a second end opposite to each other; the limiting block 130 includes a first limiting block 131 and a second limiting block 132 spaced apart in the second direction, the first limiting block 131 is located at the first end, and the second limiting block 132 is located at the second end.

According to the above solution, the limiting hole 210 is an elongated hole, a lengthwise direction of the elongated hole is the second direction, and the limiting block 130 on the convex plate 120 includes the first limiting block 131 and the second limiting block 132 spaced apart in the second direction. The first limiting block 131 can tightly engage with the elongated hole at the first end of the elongated hole; the second limiting block 132 can tightly engage with the elongated hole at the second end of the elongated hole. Thus, the left position limit and the right position limit of the board 200 in the second direction can be achieved.

It should be noted that, in practice, the limiting hole 210 may also include two through holes spaced apart in the second direction, and the position limit of the board 200 in the second direction can also be achieved through the two through holes.

It should also be noted that, in the above solution, the limiting hole 210 does not specifically refer to a through-hole structure penetrating the board 200, instead, the limiting hole 210 may refer to a blind hole structure. For example, in case that the board 200 has a sufficient thickness, the blind hole structure may be formed on the board 200 to serve as the limiting hole according to the actual needs.

Compared with implementing the limiting hole 210 by using other structures, the limiting hole 210 in the form of the elongated hole has following advantages.

In a first aspect, the limiting hole 210 is an elongated hole, so that the forming process is simple.

In a second aspect, when assembling the board 200 and the backplane 100, the assembly process can be performed by pushing the board 200 along a lengthwise direction of the elongated hole. The opening 1220 on the convex plate 120 is located on one side where the first end of the elongated hole is located. Thus, along an assembling direction F as shown in FIG. 1 (the assembling direction F is the lengthwise direction of the elongated hole), firstly the second limiting block 132 at the second end of the elongated hole may be snapped into the elongated hole to position the board 200, and then the board 200 is pushed along the assembling direction to snap the first limiting block 131 at the first end of the elongated hole into the elongated hole, so that the left position limit and the right position limit of the board 200 is achieved. At the same time, the hook on the board 200 is pressed into the opening 1220 on the convex plate 120 to achieve the snap-fit, thereby completing the assembly of the board 200 and the backplane 100. It can be seen that, by designing the limiting hole 210 as the elongated hole, the assembly becomes more convenient. The provision of the limiting hole 210 and the limiting block 130 can not only implement the left position limit and the right position limit of the board 200, but also can serve a pre-positioning purpose during assembly, thereby improving assembly efficiency.

Optionally, an inner edge of the first end of the elongated hole is curved, and an inner edge of the second end of the elongated hole is rectilinear; the first limiting block 131 has a curved surface that matches in shape with the inner edge of the first end of the elongated hole, and the second limiting block 132 has a flat surface that matches in shape with the inner edge of the second end of the elongated hole.

Figure 4:
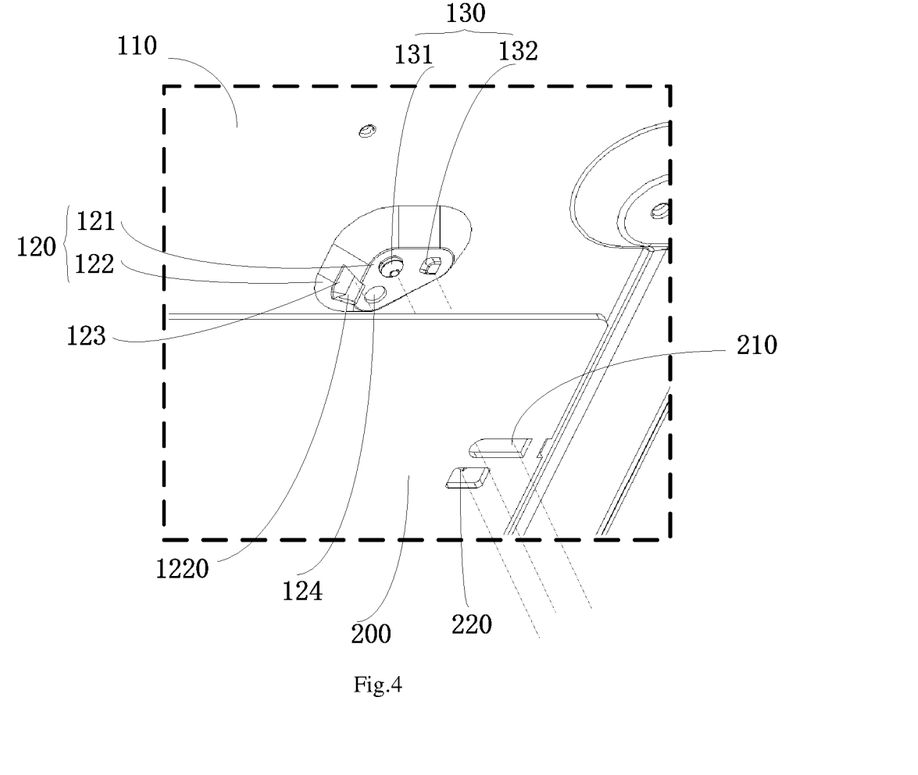
FIG. 4 is a schematic exploded view showing partial structures of a backplane and a board in a display device according to some embodiments of the present disclosure.
Figure 5:
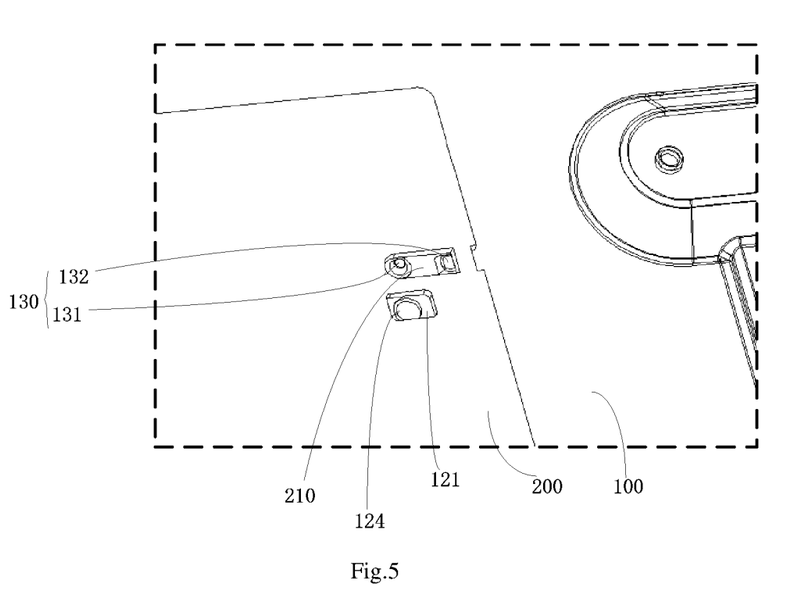
FIG. 5 is a schematic assembled view showing partial structures of a backplane and a board in a display device according to some embodiments of the present disclosure.

When the board 200 and the backplane 100 are assembled by using the above solution, as shown in FIG. 1, FIG. 4 and FIG. 5, first, the board 200 is placed on the mounting surface 110 of the backplane 100, and the elongated hole is aligned with the second limiting block 132 so that the second end of the elongated hole abuts against the flat surface of the second limiting block 132 to pre-position the board 200; then, the board 200 is pushed along the assembling direction as shown in FIG. 1, during the process, the inner edge of the first end of the elongated hole and the curved outer peripheral surface of the first limiting block 131 may serve as a guiding mechanism, so that the first limiting block 131 is snapped into the elongated hole, and fits closely with the inner edge of the first end of the elongated hole, thereby limiting the position of the board 200.

It can be seen that, the inner edge of the first end of the elongated hole is designed to be curved, and the inner edge of the second end is designed to be rectilinear. Correspondingly, the outer peripheral surface of the first limiting block 131 includes a curved surface that can closely fit with the inner edge of the first end of the elongated hole, and the outer peripheral surface of the second limiting block 132 includes a flat surface that can closely fit with the inner edge of the second end of the elongated hole, which can achieve a pre-positioning during assembly, and achieve the left position limit and the right position limit of the board 200 in a direction parallel to the mounting surface 110. Moreover, since the curved inner edge of the first end of the elongated hole fits closely with the curved surface of the first limiting block 131, the board 200 can also be limited in a third direction, that is, a front position limit and a back position limit may be achieved. The third direction is a direction perpendicular to both the first direction and the second direction.

It should also be noted that, in the above solution, for example, the inner edge of the first end of the elongated hole may be of a circular arc shape or other curved shape. Correspondingly, the curved surface on the first limiting block 131 may be of the circular arc surface or other curved shape. For example, the first limiting block 131 is a cylindrical block, and the second limiting block 132 is a cuboid block, therefore the forming process is simple. Of course, it can be understood that the specific shapes of the first limiting block 131 and the second limiting block 132 are not limited.

It should also be noted that the limiting block 130 described in the above solution is designed to be two blocks, namely the first limiting block 131 and the second limiting block 132. In practice, the limiting block 130 may also be directly designed to be an elongated block structure, which is matched in shape with the elongated hole. Because the first limiting block 131 and the second limiting block 132 are different in shape, compared with the design of a single elongated block structure, the design of two separate limiting blocks 130 is easier to implement as far as the forming process is concerned.

Figure 2:
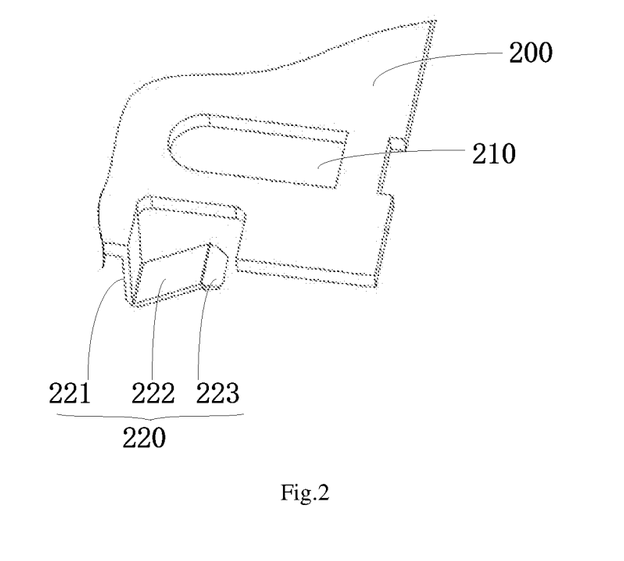
FIG. 2 is a stereogram showing a partial structure of a board in a display device according to some embodiments of the present disclosure.

The slot on the backplane 100 is described above exemplarily. Hereinafter, an optional structure of the hook on the board 200 will be described. In some embodiments of the present disclosure, as shown in FIG. 2, FIG. 3 and FIG. 4, optionally, the hook includes an elastic sheet structure 220, the elastic sheet structure 220 includes a first part 221 and a second part 222, and the first part 221 is connected to the board 200, the second part 222 is formed by bending and extending a side of the first part 221 that is away from the board 200. The elastic sheet structure 220 can be elastically deformed when subjected to an external force, thus a bending angle between the first part 221 and the second part 222 may vary, such that the elastic sheet structure 220 is snapped into or detached from the opening 1220.

According to the above solution, the structure of the hook on the board 200 is simple, and the hook is implemented by using the elastically deformable elastic sheet structure 220. When the elastic sheet structure 220 and the slot on the backplane 100 are assembled, the elastic sheet structure 220 on the board 200 is pressed into the slot on the backplane 100; in doing so, the elastic sheet structure 220 is elastically deformed. Specifically, the first part 221 and the second part 222 provided in a bent configuration are pressed by the slot, and the bending angle becomes smaller, so that the elastic sheet structure 220 can enter the slot successfully; upon entering the slot, the bending angle between the first part 221 and the second part 222 increases, so that the elastic sheet structure 220 is in snap-fit connection with the slot. When it is necessary to detach the board 200 from the backplane 100, the elastic sheet structure 220 is elastically deformed by an external force, so that the elastic sheet structure 220 can be detached from the slot.

It should be understood that the specific structure of the hook is not limited to the above-mentioned elastic sheet structure 220, but may be of other hook structures. The above specific structure is only exemplary, and does not limit the structure of the hook.

In the optional embodiment of the present disclosure, as shown in FIG. 2 and FIG. 3, the elastic sheet structure 220 and the board 200 are of an integral structure, and the elastic sheet structure 220 is formed by depressing the board 200 toward the backplane 100.

According to the above solution, the elastic sheet structure 220 may be formed integrally with the board 200, and may be formed by stamping or injection molding. This structure is easier to implement in consideration of the process, and does not incur additional material cost. Of course, it can be understood that, in practice, the elastic sheet structure 220 may also be separately connected to the board 200 by other means, such as, bonding or soldering.

In addition, in the above solution, when the elastic sheet structure 220 is pressed into the opening 1220 of the convex plate 120, a joint between the first part 221 and the second part 222 of the elastic sheet structure 220 may abut against the folded edge 123 of the side surface 122 of the convex plate 120 on the backplane 100, and a side of the second part 222 that is away from the first part 221 may abut against the top plate 121 of the convex plate 120, so that the upper position limit and the lower position limit of the elastic sheet structure 220 in the direction perpendicular to the mounting surface 110 of the backplane 100 may be achieved by using the folded edge 123 and the top plate 121 in conjunction.

In order to further ensure the reliability of the structure, as shown in FIG. 2, FIG. 3 and FIG. 4, the elastic sheet structure 220 may further include a third part 223, which is formed by bending and extending the side of the second part 222 that is away from the first part 221, the joint between the first part 221 and the second part 222 abuts against the folded edge 123, and the third part 223 abuts against the top plate 121.

According to the above solution, through forming the third portion 223 by bending the side of the second part 222 that is away from the first part 221 so that the third part 223 abuts against the top plate 121 of the convex plate 120, the third part 223 functions as a supporting plane, such that the elastic sheet structure 220 engages with the top plate 121 of the convex plate 120 more reliably.

Further, optionally, a through hole 124 leading to the cavity is provided on the top plate 121 at a position corresponding to the opening 1220. Due to the through hole 124 provided on the top plate 121 of the convex plate 120, when the board 200 is to be detached from the backplane 100, an person can apply an external force to the elastic sheet structure 220 through the through hole 124, so that the elastic sheet structure 220 is deformed and detached from the slot of the backplane 100. In addition, in the above solution, the elastic sheet structure 220 is further provided with the third part 223. Since the third part 223 has the supporting plane, it is also more beneficial to apply the external force to the third part 223 through the through hole 124, to deform the elastic sheet structure 220 and detach it from the slot.

In addition, as shown in FIG. 1, in the optional embodiment of the present disclosure, the first limiting block 131 and the second limiting block 132 are spaced apart in the second direction, and the through hole 124 is arranged adjacent to the first limiting block 131. In consideration of the component structure of the display device, a spatial layout of the convex plate 120 and the elastic sheet structure 220 should be as compact as possible. Therefore, optionally, the top plate 121 of the convex plate 120 is substantially triangular, as long as the top plate 121 have sufficient space to arrange the first limiting block 131, the second limiting block 132 and the through hole 124. Of course, it can be understood that, in practice, the top plate 121 may be of other shape, which is not limited herein.

In addition, as shown in FIG. 1, the opening 1220 on the side surface 122 of the convex plate 120 is not arranged on an extension of an imaginary line connecting the first limiting block 131 and the second limiting block 132 in the second direction, but is arranged on one side of the extension, so that the through hole 124 can be arranged on the top plate 121. In practice, the opening 1220 on the side surface 122 of the convex plate 120 may also be arranged on the extension of the imaginary line connecting the first limiting block 131 and the second limiting block 132 in the second direction, so that an area of the top plate 121 of the convex plate 120 can be smaller, so as to reduce the space occupied by the top plate 121 of the convex plate 120 in the third direction (for example, the third direction can be perpendicular to both the second direction and the first direction). The elastic sheet structure 220 on the board 200 corresponds to the opening 1220 in position; the limiting hole 210 corresponds to the first limiting block 131 and the second limiting block 132 in position. Therefore, a description of the position arrangement of the elastic sheet structure 220 and the limiting hole on the board 200 is not repeated here.

The above embodiments are merely optional embodiments of the present disclosure. It should be noted that improvements and modifications may be made by those skilled in the art without departing from the principle of the present disclosure, and these improvements and modifications should also be deemed as falling within the scope of the present disclosure.

What is claimed is:

1. A display device, comprising:
a backplane;
a board;
a first fastener, arranged on the backplane; and
a second fastener, arranged on the board,
wherein the first fastener is in snap-fit connection with the second fastener,
wherein the first fastener comprises a plurality of slots provided on the backplane, the second fastener comprises a plurality of hooks provided on the board, and the hooks are snapped into the slots,
wherein the backplane comprises a mounting surface for mounting the board, a convex plate is arranged on the mounting surface, a cavity is provided inside the convex plate, the convex plate comprises a top plate and a side surface surrounding the top plate peripherally, and the slots each comprise an opening arranged on the side surface and leading to the cavity, and
wherein:
a limiting block is protrudingly provided on the top plate;
a limiting hole cooperating with the limiting block is provided on the board, and the limiting hole is located on one side of a respective hook;
the limiting block is placed in the limiting hole; and
the limiting block cooperates with the limiting hole to limit a position of the board in a direction parallel to the mounting surface.

2. The display device according to claim 1, wherein the first fastener is in detachable snap-fit connection with the second fastener.

3. The display device according to claim 1, wherein the convex plate and the backplane are provided integrally.

4. The display device according to claim 1, wherein
the opening of each slot comprises a first edge located on a side proximate to the top plate and a second edge opposite to the first edge, and a folded edge is provided at the second edge;
the folded edge is integrally connected with the side surface, and is bent into the cavity; and
the folded edge cooperates with the top plate to limit a position of a respective hook in a first direction perpendicular to the mounting surface.

5. The display device according to claim 4, wherein
the respective hook comprises an elastic sheet structure, the elastic sheet structure comprises a first part and a second part, and the first part is connected to the board, the second part is formed by bending and extending a side of the first part that is away from the board, and the elastic sheet structure is in snap-fit connection with the opening.

6. The display device according to claim 5, wherein
the elastic sheet structure and the board are of an integral structure, and the elastic sheet structure is formed by depressing the board toward the backplane.

7. The display device according to claim 5, wherein the elastic sheet structure is V-shaped.

8. The display device according to claim 5, wherein
the elastic sheet structure further comprises a third part, the third part is formed by bending and extending a side of the second part that is away from the first part, a joint between the first part and the second part abuts against the folded edge, and the third part abuts against the top plate.

9. The display device according to claim 1, wherein
the limiting hole is an elongated hole extending in a second direction parallel to the mounting surface, and the elongated hole comprises a first end and a second end opposite to each other; and
the limiting block comprises a first limiting block and a second limiting block spaced apart in the second direction, the first limiting block is located at the first end, and the second limiting block is located at the second end.

10. The display device according to claim 9, wherein
an inner edge of the first end of the elongated hole is curved, and an inner edge of the second end of the elongated hole is rectilinear; and the first limiting block has a curved surface that matches in shape with the inner edge of the first end of the elongated hole, and the second limiting block has a flat surface that matches in shape with the inner edge of the second end of the elongated hole.

11. The display device according to claim 1, wherein the top plate is provided, at a position corresponding to the opening, with a through hole leading to the cavity.

12. A display device, comprising:
a backplane;
a board;
a first fastener, arranged on the backplane; and
a second fastener, arranged on the board,
wherein the first fastener is in snap-fit connection with the second fastener,
wherein the first fastener comprises a plurality of slots provided on the backplane, the second fastener comprises a plurality of hooks provided on the board, and the hooks are snapped into the slots,
wherein the backplane comprises a mounting surface for mounting the board, a convex plate is arranged on the mounting surface, a cavity is provided inside the convex plate, the convex plate comprises a top plate and a side surface surrounding the top plate peripherally, and the slots each comprise an opening arranged on the side surface and leading to the cavity,
wherein:
the opening of each slot comprises a first edge located on a side proximate to the top plate and a second edge opposite to the first edge, and a folded edge is provided at the second edge;
the folded edge is integrally connected with the side surface, and is bent into the cavity; and
the folded edge cooperates with the top plate to limit a position of a respective hook in a first direction perpendicular to the mounting surface, and
wherein the respective hook comprises an elastic sheet structure, the elastic sheet structure comprises a first part and a second part, and the first part is connected to the board, the second part is formed by bending and extending a side of the first part that is away from the board, and the elastic sheet structure is in snap-fit connection with the opening.

13. The display device according to claim 12, wherein the elastic sheet structure and the board are of an integral structure, and the elastic sheet structure is formed by depressing the board toward the backplane.

14. The display device according to claim 12, wherein the elastic sheet structure is V-shaped.

15. The display device according to claim 12, wherein the elastic sheet structure further comprises a third part, the third part is formed by bending and extending a side of the second part that is away from the first part, a joint between the first part and the second part abuts against the folded edge, and the third part abuts against the top plate.

* * * * *